United States Patent
Yu et al.

(10) Patent No.: US 8,831,038 B2
(45) Date of Patent: *Sep. 9, 2014

(54) TRANSMISSION STREAM GENERATING DEVICE FOR GENERATING TRANSMISSION STREAM WHICH ADDITIONAL DATA IS STUFFED IN A PAYLOAD AREA OF A PACKET, DIGITAL BROADCAST TRANSMITTING/RECEIVING DEVICE FOR TRANSMITTING/RECEIVING THE TRANSMISSION STREAM, AND METHODS THEREOF

(71) Applicant: Samsung Electronics Co., Ltd., Gyeonggi-do (KR)

(72) Inventors: Jung-pil Yu, Seongnam-si (KR); Hae-joo Jeong, Seoul (KR); Chan-sub Park, Incheon (KR); Kum-ran Ji, Seoul (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

This patent is subject to a terminal disclaimer.

(21) Appl. No.: 13/846,520

(22) Filed: Mar. 18, 2013

(65) Prior Publication Data

US 2013/0208777 A1    Aug. 15, 2013

Related U.S. Application Data

(63) Continuation of application No. 12/617,912, filed on Nov. 13, 2009, which is a continuation of application No. 12/305,041, filed as application No. PCT/KR2007/002953 on Jun. 18, 2007, now Pat. No. 8,599,875.

(60) Provisional application No. 60/814,070, filed on Jun. 16, 2006.

(51) Int. Cl.
| | |
|---|---|
| H04J 3/16 | (2006.01) |
| H03M 13/23 | (2006.01) |
| H04N 21/438 | (2011.01) |
| H04B 1/16 | (2006.01) |
| H04N 7/26 | (2006.01) |
| H04N 21/2383 | (2011.01) |
| H04N 21/2662 | (2011.01) |
| H04L 1/00 | (2006.01) |

(52) U.S. Cl.
CPC ............... *H04B 1/16* (2013.01); *H03M 13/235* (2013.01); *H04L 1/0066* (2013.01); *H04N 21/4382* (2013.01); *H04N 19/00533* (2013.01); *H04N 21/2383* (2013.01); *H04L 1/0059* (2013.01); *H04L 2001/0093* (2013.01); *H04N 21/2662* (2013.01)
USPC ......................................................... 370/471

(58) Field of Classification Search
USPC ........................................ 714/784; 370/471
See application file for complete search history.

(56) References Cited

U.S. PATENT DOCUMENTS

| | | | |
|---|---|---|---|
| 5,650,825 A | 7/1997 | Naimpally et al. | |
| 6,202,189 B1 | 3/2001 | Hinedi et al. | |
| 6,763,390 B1 | 7/2004 | Kovacevic et al. | |
| 6,785,733 B1 | 8/2004 | Mimura et al. | |
| 7,599,348 B2 | 10/2009 | Kang et al. | |
| 2002/0126222 A1 | 9/2002 | Choi et al. | |
| 2004/0237024 A1* | 11/2004 | Limberg | 714/784 |
| 2005/0152446 A1 | 7/2005 | Choi et al. | |
| 2005/0157758 A1 | 7/2005 | Yoo | |
| 2007/0091885 A1 | 4/2007 | Yu et al. | |
| 2010/0122126 A1 | 5/2010 | Choi et al. | |

FOREIGN PATENT DOCUMENTS

| | | |
|---|---|---|
| CA | 2 679 049 A1 | 12/2005 |
| EP | 1 555 826 A1 | 7/2005 |
| KR | 1998-45092 B1 | 9/1998 |
| KR | 10-2005-0075654 A | 7/2005 |
| KR | 10-2005-0109052 A | 11/2005 |
| WO | 02/085014 A1 | 10/2002 |
| WO | 2005/120062 A1 | 12/2005 |

| | | | |
|---|---|---|---|
| WO | 2005/122573 A1 | 12/2005 | |
| WO | 2006/001635 A1 | 1/2006 | |
| WO | 2007/078123 A1 | 7/2007 | |

OTHER PUBLICATIONS

Communication, dated Jan. 23, 2012, issued by the Mexican Patent Office in corresponds Mexican Application No. MX/a/2009/012242.
Communication, dated Feb. 8, 2012, issued by the Mexican Patent Office in corresponding Mexican Application No. MX/a/2009/012249.
Communication dated Sep. 19, 2012, issued by the Canadian Patent Office in counterpart Canadian Patent Application No. 2,645,533.
International Preliminary Report issued in International Application No. PCT/KR2007/002953.
Communication, dated May 13, 2013, issued by the European Patent Office in counterpart European Patent Application No. 09174735.2.
Communication, dated May 13, 2013, issued by the European Patent Office in counterpart European Patent Application No. 09174737.8.
Communication, dated May 13, 2013, issued by the European Patent Office in counterpart European Patent Application No. 09177110.5.
Park, Eui Jun, et al., "Supplementary Reference Sequence VSB System," Consumer Electronics, ICCE, IEEE, Jan. 1, 2007, pp. 1-2.
Lung, "NAB RF Reflections: A-VSB and DTx," TVTechnology, http://www.tvtechnology.com/conference-updates/0136/nab-rf-reflections-a-vsb-and-dtx/183609, Jun. 14, 2006, 2 pages.
"ATSC Recommended Practice: E-VSB Implementation Guidelines," Advanced Television Systems Committee, http://www.atsc.org/cms/standards/a_112.pdf, Apr. 18, 2006, pp. 1-116.
Communication, dated Aug. 30, 2013, issued by the Korean Intellectual Property Office in counterpart Korean Patent Application No. 10-2009-7001004.
Communication, dated Sep. 27, 2013, issued by the State Intellectual Property Office of P.R. China in counterpart Chinese Patent Application No. 200910174010.6.
Communication dated Mar. 25, 2014 issued by the European Patent Office in counterpart European Patent Application No. 09 174 735.2.
Communication dated Mar. 25, 2014 issued by the European Patent Office in counterpart European Patent Application No. 09 174 737.8.
Communication dated Mar. 25, 2014 issued by the European Patent Office in counterpart European Patent Application No. 09 177 110.5.

* cited by examiner

*Primary Examiner* — Mark Rinehart
*Assistant Examiner* — Gbemileke Onamuti
(74) *Attorney, Agent, or Firm* — Sughrue Mion, PLLC

(57) ABSTRACT

A transmission stream (TS) generating apparatus includes an adaptor which receives general data and generates a stream having a plurality of packets, and which provides adaptive field in some of the plurality of packets, and an inserter which inserts additional data into all the payload areas of some of the plurality of packets that are not provided with the adaptive fields. Because additional data is transmitted, without requiring adaptive field header in certain packet, a data transmission rate is increased.

6 Claims, 7 Drawing Sheets

| Sync | PID | SRS | | TS 1 | TS 2 |
|------|-----|-----|---|------|------|
| Sync | PID | SRS | | TS 3 | |
| Sync | PID | AF HEADER | SRS | TS 4 | NS |
| Sync | PID | AF HEADER | SRS | NS | |

TRANSMISSION STREAM GENERATING DEVICE FOR GENERATING TRANSMISSION STREAM WHICH ADDITIONAL DATA IS STUFFED IN A PAYLOAD AREA OF A PACKET, DIGITAL BROADCAST TRANSMITTING/RECEIVING DEVICE FOR TRANSMITTING/RECEIVING THE TRANSMISSION STREAM, AND METHODS THEREOF

CROSS-REFERENCE TO RELATED APPLICATIONS

This application is a continuation of application Ser. No. 12/617,912 filed on Nov. 13, 2009, which is a continuation of application Ser. No. 12/305,041 filed on Dec. 16, 2008, which claims the benefit of PCT International Patent Application No. PCT/KR2007/002953, filed Jun. 18, 2007, and Provisional Application No. 60/814,070, filed on Jun. 16, 2006, the disclosures of which are incorporated herein by reference.

BACKGROUND OF THE INVENTION

1. Field of the Invention

Aspects of the present invention relate to a transmission stream (TS) generating device, a digital broadcast transmitting/receiving device to transmit/receive the TS, and methods thereof, and more particularly, to a TS generating device to stuff in supplementary data by utilizing a payload area of a packet, and to generate a TS, a digital broadcast transmitting/receiving device to transmit/receive the generated stream, and methods thereof.

2. Description of the Related Art

The advent of electronic and communication technologies brought in digitalization of broadcast system, and as a result, a variety of digital broadcast standards are being offered. Examples of such broadcast standards are the U.S-oriented ATSC VSB standard, and the Europe-oriented DVB-T standard. These two standards vary from each other in many ways, such as audio compression, channel bands, number of carrier waves, etc.

The U.S-oriented 8-VSB system defines a VSB data frame as including two fields. Each field includes one field sync segment, which is the first segment, and 312 other data segments. One segment of VSB data frame corresponds to one MPEG-2 packet, and one segment includes 4 symbols of segment sync and 828 data symbols.

Under this frame standard, it is necessary to use a private field within an adaptation field in order to transmit data other than normal data. A 2-byte-long adaptation field header has to be provided to define an adaptation field within a packet.

As a result, the amount of data transmission decreases as much as the adaptation field header occupies the portion, and data transmission efficiency degrades.

SUMMARY OF THE INVENTION

Aspects of the present invention provide a transmission stream (TS) generating device to stuff in supplementary data by utilizing a payload area of a packet in generating a TS, and is thus capable of improving data transmission efficiency which would be degraded if an adaptation field header is used; a digital broadcast transmitting/receiving apparatus for transmitting/receiving the generated TS; and methods thereof.

According to an aspect of the present invention, a transmission stream (TS) generating device is provided. The TS generating device includes an adapter unit to receive normal data, to construct a stream having a plurality of packets, and to provide adaptation fields in some of the plurality of packets, and a stuffing unit to stuff supplementary data to the entire payload region of the packets that do not have the adaptation fields.

According to another aspect of the present invention, the stuffing unit divides and stuffs a plurality of supplementary data packets into the entire payload region of the packets that do not have the adaptation fields.

According to another aspect of the present invention, the stuffing unit divides and stuff a plurality of supplementary data packets into the entire payload region of first packets from among the packets that do not have the adaptation fields, and inserts one supplementary data packet into the entire payload region of second packets from among the packets that do not have the adaptation fields.

According to another aspect of the present invention, the adapter unit defines a packet having a new packet identifier (PID), and generates a stream having the defined packet, wherein the stuffing unit stuffs the supplementary data into the entire payload region of the defined packet.

According to another aspect of the present invention, the adapter unit provides an adaptation field of a predetermined size on a packet in which the normal data are written in a payload region, the adaptation field including an adaptation field header and an adaptation field payload.

According to another aspect of the present invention, the stuffing unit stuffs the supplementary data such that the plurality of packets constituting the stream are in the same pattern at an interval corresponding to a predetermined number of packets, the predetermined number corresponding to one of the divisors of number 12.

According to another aspect of the present invention, the supplementary data includes turbo coding data.

According to another aspect of the present invention, a digital broadcast transmitting apparatus is provided. The digital broadcast transmitting apparatus includes a transmission stream (TS) generating device to receive normal data, to generate a stream having a plurality of packets, and to stuff supplementary data in payload regions of some of the plurality of packets, a randomizer to randomize the stream, a supplementary reference signal (SRS) stuffer to stuff the SRS in each packet of the randomized stream, and a transmission signal processor to modulate the randomized stream and to output the result of the modulation.

According to another aspect of the present invention, a transmission stream (TS) generating method is provided. The method includes receiving normal data, generating a stream having a plurality of packets, and providing adaptation fields in some of the plurality of packets, and stuffing supplementary data in the entire payload regions of the packets that do not have the adaptation fields.

According to another aspect of the present invention, the stuffing of the supplementary data comprises dividing and stuffing a plurality of supplementary data packets in the entire payload regions of the packets that do not have the adaptation fields.

According to another aspect of the present invention, the stuffing of the supplementary data comprises dividing and stuffing a plurality of supplementary data packets in the entire payload regions of first packets from among the packets that do not have the adaptation fields, and stuffing one supplementary data packet in the entire payload regions of second packets from among the packets that do not have the adaptation fields.

According to another aspect of the present invention, the generating of the stream comprises defining a packet having a new packet identifier (PID) and generating a stream having the defined packet, and the stuffing of the supplementary data comprises stuffing the supplementary data in the entire payload region of the defined packet.

According to another aspect of the present invention, the stuffing of the supplementary data comprises providing an adaptation field of a predetermined size on a packet in which the normal data are written in a payload region, the adaptation field including an adaptation field header and an adaptation field payload.

According to another aspect of the present invention, the stuffing of the supplementary data comprises stuffing the supplementary data such that the plurality of packets constituting the stream are in the same pattern at an interval corresponding to a predetermined number of packets, the predetermined number corresponding to one of the divisors of 12.

According to another aspect of the present invention, a digital broadcast receiving apparatus is provided. The digital broadcast receiving apparatus includes a demodulator to receive a transmission stream (TS) having a plurality of packets, and supplementary data stuffed in the entire payload regions of some of the plurality of packets, an equalizer to equalize the demodulated TS, and a data processor to detect a normal data stream and a supplementary data stream from packet payload regions of the equalized TS, and to decode the detected streams to so as to recover normal data and the supplementary data.

According to another aspect of the present invention, a plurality of supplementary data packets are divided and stuffed in the entire payload regions of the packets that do not have the adaptation fields.

According to another aspect of the present invention, a plurality of supplementary data packets are divided and stuffed in the entire payload regions of first packets from among the packets that do not have the adaptation fields, and one supplementary data packet is stuffed in the entire payload regions of second packets from among the packets that do not have the adaptation fields.

According to another aspect of the present invention, the supplementary data are stuffed in a manner such that the plurality of packets constituting the stream are in the same pattern at an interval corresponding to a predetermined number of packets, the predetermined number corresponding to one of the divisors of 12.

According to another aspect of the present invention, the data processor includes a MUX to detect the normal data stream and the supplementary data stream from the equalized TS, a decoder to decode the detected normal data stream, a supplementary data decoder to decode the detected supplementary data stream, a stream stuffer to stuff the supplementary data stream decoded at the supplementary data decoder into a decoding stream output from the decoder, a de-interleaver to de-interleave the equalized TS processed at the stream stuffer, a RS decoder to reed-solomon decode the de-interleaved TS, a de-randomizer to de-randomize the RS-decoded TS, and a de-MUX to de-multiplex the de-randomized TS to recover the normal data and the supplementary data.

According to another aspect of the present invention, the data processor includes a MUX to detect the normal data stream and the supplementary data stream from the equalized TS, a first processor to decode the detected normal data stream so as to recover the normal data, and a second processor to decode the detected supplementary data stream so as to recover the supplementary data.

According to another aspect of the present invention, the first processor includes a decoder to perform error correction on normal data stream within the equalized TS, and to decode the error-corrected normal data stream, a first de-interleaver to de-interleave the stream output from the decoder, a reed-solomon (RS) decoder to RS-decode the de-interleaved stream, and a first de-randomizer to de-randomize the RS-decoded stream to recover the normal data.

According to another aspect of the present invention, the second processor includes a supplementary data decoder to decode supplementary data stream within the equalized transmission stream (TS), a second de-interleaver to de-interleave the decoded stream output from the supplementary data decoder, a parity remover to remove parities from the de-interleaved stream from the second de-interleaver, a second de-randomizer to de-randomize the parity-removed stream, and a data recovery unit to recover the supplementary data from the de-randomized stream.

According to another aspect of the present invention, a digital broadcast receiving method is provided. The method includes receiving a transmission stream (TS) having a plurality of packets and in which supplementary data are stuffed in the entire payload regions of some packets, and demodulating the received TS, equalizing the demodulated TS, detecting a normal data stream and a supplementary data stream from the payload regions of the packets of the equalized TS, and decoding the detected streams so as to recover normal data and supplementary data.

According to aspects of the present invention, supplementary data is stuffed by utilizing a payload area of a packet, in generating a stream. Therefore, depending on packets, even the supplementary data is transmitted, without having to use an adaptation field, and as a result, data transmission efficiency, which would be degraded if an adaptation field header is used, is improved.

Additional aspects and/or advantages of the invention will be set forth in part in the description which follows and, in part, will be obvious from the description, or may be learned by practice of the invention.

BRIEF DESCRIPTION OF THE DRAWINGS

These and/or other aspects and advantages of the invention will become apparent and more readily appreciated from the following description of the embodiments, taken in conjunction with the accompanying drawings of which.

DETAILED DESCRIPTION OF THE EMBODIMENTS

Figure 1:
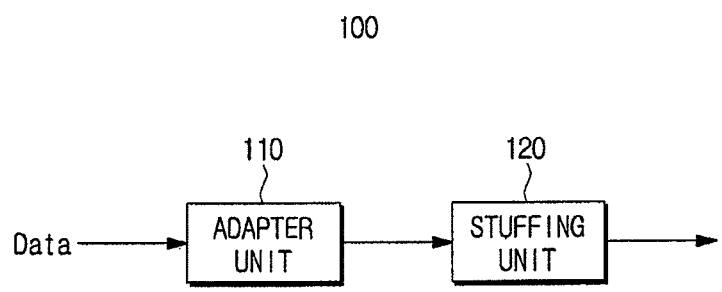
FIG. 1 is a block diagram of a transmission stream (TS) generating device according to an example embodiment of the present invention.

Reference will now be made in detail to the present embodiments of the present invention, examples of which are illustrated in the accompanying drawings, wherein like reference numerals refer to the like elements throughout. The embodiments are described below in order to explain the present invention by referring to the figures.

FIG. 1 is a block diagram of a transmission stream (TS) generating device 100 according to an example embodiment of the present invention. The TS generating device 100 includes an adapter unit 110 and a stuffing unit 120. According to other aspects of the invention, the TS generating device 100 may include additional and/or different units.

The adapter unit 110 receives normal data and generates a stream having a plurality of packets. In this process, the adapter unit 110 generates an adaptation field in some of the plurality of packets. The adapter unit 110 may generate a stream which contains a predefined packet having a new packet identifier (PID) so that supplementary data can be stuffed in some of the packets.

An adaptation field is provided at one part of a packet, to be used adaptively. An adaptation field includes an adaptation field header (AF header), optional field, and stuffing region. The AF field records therein information about a location and a size of adaptation field, and the like. The optional field is to selectively use a program clock reference (PCR) flag, an original program clock reference (OPCR) flag, a splicing point flag, a private data flag, or an adaptation field extension flag. The stuffing region is where supplementary data can be added.

The stuffing unit 120 stuffs supplementary data into the entire payload region of some packets of the generated stream that do not have adaptation fields. The supplementary data may include turbo coding data. The turbo coding data may be generated by compressing data in a compression standard which is different from the one applied to normal data, and by robust-processing the data. The stuffing unit 120 receives supplementary data from an external module such as a broadcast recording apparatus, or from a variety of internal modules, such as a compression module. The compression module may be, for example, an MPEG-2 module, a video encoder, or an audio encoder. The stuffing unit 100 stuffs the received data in the stream generated at the adapter unit 110.

The adapter unit 110 does not generate an adaptation field for a packet if supplementary data is going to be stuffed in the entire payload region of the packet. Because additional regions, such as an adaptation field header, are not used in the packets where supplementary data is stuffed into the entire payload region, the data transmission rate is improved.

Although not shown in FIG. 1, the TS generating device 100 may further include additional components, such as a Reed-Solomon (RS) encoder (not shown), an interleaver (not shown), and a duplicator. The RS encoder may receive supplementary data externally and perform RS encoding. The RS encoder may receive a supplementary data stream containing a sync signal region. The supplementary data stream may include total 188 bytes of packets, and these may include 1 byte of sync signal, 3 bytes of header, and 184 bytes of supplementary data. The RS encoder removes the sync signal from the supplementary data stream, computes parities regarding the supplementary data region, and adds 20-byte-long parities. As a result, a packet of the final result of encoding the supplementary data stream includes total 207 bytes. Among these, 3 bytes may be allocated to the header, 184 bytes to the supplementary data, and 20 bytes to the parities.

An interleaver (not shown) interleaves the RS-encoded supplementary data stream, and provides the duplicator (not shown) with the result. The duplicator generates a parity stuffing region in the supplementary data stream, and provides the stuffing unit with the supplementary data stream. Accordingly, by stuffing parities of the supplementary data stream during the processing for transmitting the generated stream, supplementary data can be processed more robustly.

Figure 2:
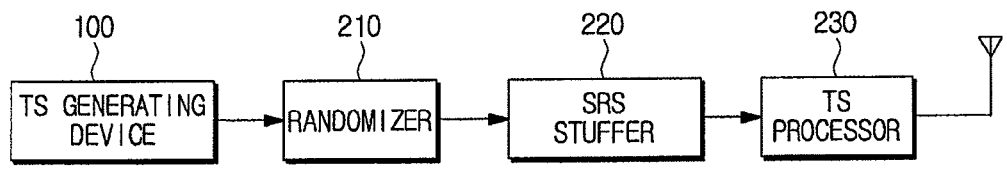
FIG. 2 is a block diagram of a digital broadcast transmitting apparatus according to an example embodiment of the present invention.

FIG. 2 is a block diagram of a digital broadcast transmitting apparatus according to an example embodiment of the present invention. The digital broadcast transmitting apparatus includes a TS generating device 100, a randomizer 210, an supplementary reference signal stuffer 220, and a TS processor 230. According to other aspects of the present invention, the digital broadcast transmitting apparatus may include additional and/or different units. Similarly, the functionality of two or more of the above units may be integrated into a single component.

The TS generating device 100 may have the same structure as that shown in FIG. 1. Accordingly, the TS generating device 100 outputs a stream which contains packets having supplementary data stuffed in the payload region, and packets having normal data stuffed in the payload region.

The randomizer 210 randomizes the stream being output from the TS generating device 100.

The supplementary reference signal (SRS) stuffer 220 may stuff a supplementary reference signal with respect to the packets provided in the randomized stream. The SRS refers to a sequence which is already known to both of a digital broadcast transmitting apparatus and a digital broadcast receiving apparatus. The SRS may be inserted in the stream as the supplementary data, and transmitted so that the receiving device can perform synchronization and channel equalization.

The SRS stuffer 220 may stuff SRS in an adaptation field, if a packet has an adaptation field therein. If a packet has supplementary data stuffed in a payload region and therefore may not have an adaptation field, the SRS may be stuffed in the payload region together with the supplementary data.

The TS processor 230 modulates the stream output from the SRS stuffer 220, and sends the modulated stream out through a radio frequency (RF) channel.

The TS processor 230 may be configured to include a RS encoder (not shown), an interleaver (not shown), a trellis encoder (not shown), a MUX (not shown), a pilot inserter (not shown), a VSB modulator (not shown), and a RF up-converter (not shown). The RS encoder performs RS encoding to add parity bytes to the TS so that error by channel characteristic during the transmission can be corrected. The interleaver interleaves the RS-encoded data according to interleaving rule, and the trellis encoder trellis encodes the data. The MUX inserts field sync and segment sync into the trellis-encoded TS. The pilot inserter inserts a pilot tone by adding a DC value to a signal output from the MUX. The VSB modulator performs VSB modulation, and the RF up-converter up-converts the signal into RF channel band signal, and outputs the signal over an antenna. As explained above, the TS processor 230 converts a signal generated at the TS generating apparatus 100 into a single carrier signal in time domain, and outputs the result.

The TS processor 230 may further include a turbo processor (not shown) to decode the supplementary data more robustly. The turbo processor may encode the supplementary data, by detecting supplementary data stream from the stream, computing a parity regarding the supplementary data stream, and stuffing the parity into the parity stuffing region. The turbo processor may then interleave the encoded supplementary data stream, and stuff the supplementary data stream back into the stream so that the stream can be restructured.

Figure 3:
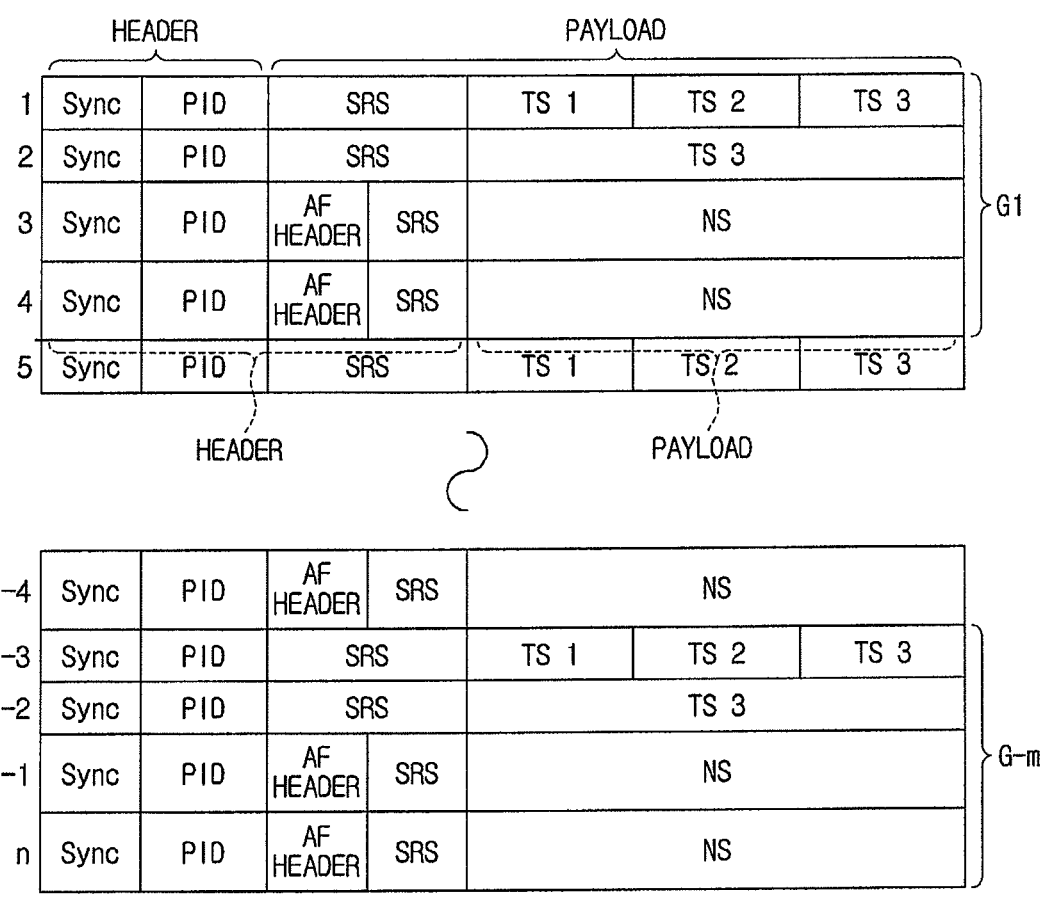
FIGS. 3 and 4 are provided to explain a variety of examples of structures of streams being generated at the TS generating device.
Figures 4, 5:
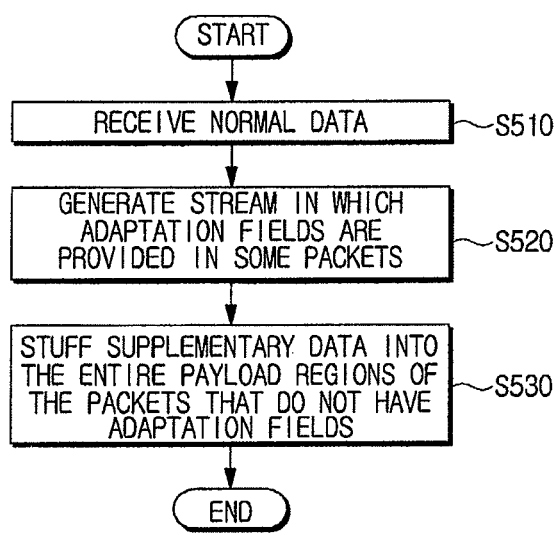
FIG. 5 is a flowchart of a process of generating a transmission stream (TS) according to an example embodiment of the present invention.

FIGS. 3 and 4 show various configurations of a stream being generated at the TS generating device of FIG. 1 or FIG. 2. Referring to FIG. 3, one stream includes a plurality of packets (1~n), and each packet is divided into a header and a payload region.

As shown in FIG. 3, the first packet 1 is divided into a header region containing a sync and a packet identifier (PID), and a payload region containing supplementary data packets, including SRS and turbo streams TS1, TS2, and TS3. As shown in FIG. 3, the first packet 1 does not have an adaptation field. Supplementary data, such as SRS, TS1, TS2, and TS3, are stuffed in the entire payload region of the first packet 1. As explained above, the stuffing unit 120 may distribute and stuff a plurality of supplementary data packets TS1 to TS2 into the payload region of the packet where no adaptation field is provided. Additionally, the SRS stuffer 220 may insert the SRS into the payload region of the packet as the supplementary data.

In the second packet 2, SRS and TS3 are stuffed in the entire payload region. As explained above, the stuffing unit 120 may stuff the turbo stream TS3 in the payload region of a packet where no adaptation field is provided.

The third and fourth packets 3 and 4 are provided for the transmission of normal data. These packets are provided with adaptation fields by the adapter unit 110. The SRS stuffer 220 stuffs SRS in the payload region of the adaptation field. Accordingly, the AF header is defined together.

The fifth packet 5 is generated in the same pattern as the first packet 1. Patterns of the respective packets repeat in the cycle of 4 packets. As explained above, the stuffing unit 120 may stuff supplementary data in the packet at a predetermined location, so that a plurality of packets can be arranged in a pattern where packets in predetermined locations are in the same pattern. A group of four packets (G1, . . . , G-m) may be repeatedly generated.

The number of packets in one cycle may be set according to the number of trellis encoder blocks (not shown). For example, if there are 12 trellis encoder blocks (not shown) provided to perform stream encoding, the stuffing unit 120 stuffs supplementary data in a manner such that the packets in every first, second, third, fourth, sixth, or twelfth locations, which are the divisors of number 12, are in the same pattern. By doing so, the size of a supplementary data region that can be processed within the trellis encoder block can be extended as large as possible.

FIG. 4 shows a packet configured in different pattern from the one shown in FIG. 3. As shown in FIG. 4, the AF is not provided in the first and second packets where only the supplementary data stream (SRS, TS1, TS2, TS3) are stuffed, while AF is provided in the third and fourth packets where supplementary data (SRS, TS4) and normal stream (NS) are stuffed. SRS is stuffed in the payload region of the first and second packets, and stuffed in the AF in the third and fourth packets. By utilizing the AF header, which takes 2 bytes for each packet, data transmission rate can be enhanced.

The adapter unit 110 and the stuffing unit 120 may generate a stream in various patterns other than that shown in FIG. 3 or FIG. 4. For example, the adapter unit 110 may generate packets having AFs and packets without AFs alternately, and the stuffing unit 120 may insert supplementary data in the payload regions of the packets without AFs. As explained above, stream configuration may be varied in many ways.

FIG. 5 is a flowchart of a process of generating a TS according to an example embodiment of the present invention. Normal data is received at block S510, and accordingly, a stream having a plurality of packets is constructed at block S520. A new PID may be defined and a packet may be added. An adaptation field is created in some of the packets. The packets having adaptation fields and the packets without adaptation fields may be arranged according to a predetermined pattern. For example, the packets may be arranged in 2:2 ratio as shown in FIGS. 3 and 4, or in various ratios, such as 1:1, 1:3, or 3:3.

Supplementary data is stuffed in the entire payload region of the packets without adaptation field at block S530. The supplementary data may be turbo coding data. The supplementary data may also include SRS. As supplementary data is stuffed in the normal payload region of the packets, it may be unnecessary to provide regions such as the adaptation field header, and accordingly, these regions are omitted. If the packets have adaptation fields, supplementary data is stuffed in the adaptation fields. Accordingly, the adaptation field header distinguishes supplementary data stuffed in the adaptation field from the normal data stuffed in the normal payload region.

Figure 6:
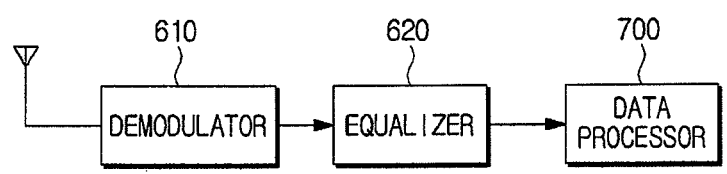
FIG. 6 is a block diagram of a digital broadcast receiving apparatus according to an example embodiment of the present invention.

FIG. 6 is a block diagram of a digital broadcast receiving apparatus according to an example embodiment of the present invention. The digital broadcast receiving apparatus includes a demodulator 610, an equalizer 620, and a data processor 700.

The demodulator 610 receives a stream transmitted from the digital broadcast transmitting device over an antenna, and demodulates the received stream. The stream received and demodulated at the demodulator 610 may be the stream being generated at the TS generating device shown in FIG. 1. Accordingly, the received stream may have a configuration as shown in FIG. 3 or FIG. 4. A stream includes a plurality of packets, and supplementary data is stuffed in the entire payload of some packets. The packets having supplementary data stuffed therein are the packets that do not have an adaptation field, including an adaptation field header and an adaptation field payload.

The equalizer 620 equalizes the demodulated TS. If SRS exists in the supplementary data, the equalizer 620 may perform channel equalization using SRS.

The data processor 700 detects a normal data stream and a supplementary data stream from the payload regions of packets of the equalized TS, and decodes the detected streams to recover normal data and supplementary data. The data processor 700 may be configured in various ways.

Figure 7:
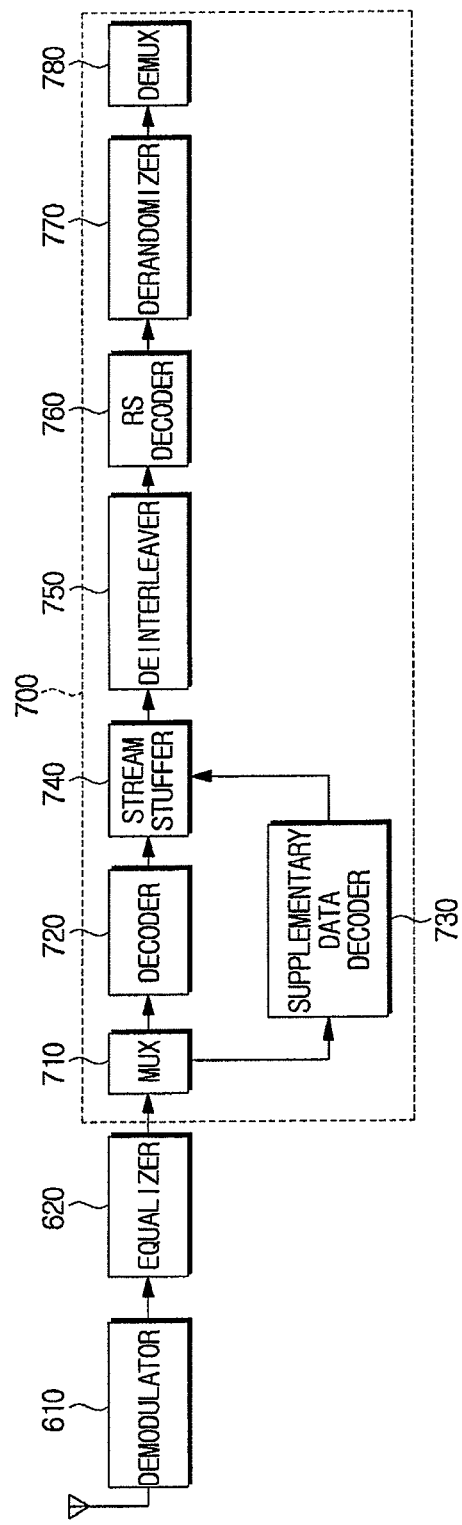
FIGS. 7 and 8 are block diagrams provided to explain a variety of examples of structure of a digital broadcast receiving apparatus according to an example embodiment of the present invention.
Figure 8:
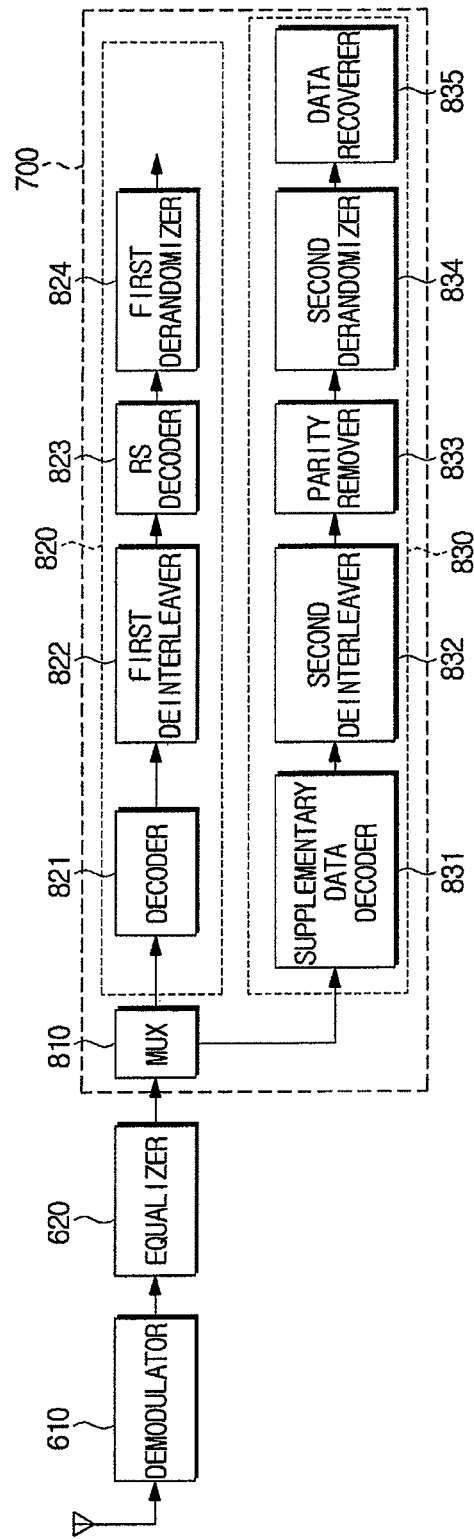

FIGS. 7 and 8 are block diagrams of a configuration of a digital broadcast receiving device having data processors 700 of various structures according to example embodiments of the present invention.

According to an example embodiment shown in FIG. 7, the data processor 700 includes a MUX 710, a decoder 720, a supplementary data decoder 730, a stream stuffer 740, a deinterleaver 750, a RS decoder 760, and a de-randomizer 770.

The MUX 710 detects a normal data stream and a supplementary data stream from the equalized TS. The MUX 710 detects a supplementary data stream from a predetermined location according to the pattern of the packets applied in the stream generating process, and detects normal data stream from the other locations. If packets of a predetermined cycle based on one of the divisors of number 12 are in same pattern, it is possible to check the locations of stuffing in the supplementary data streams periodically, and to detect the supplementary data streams. The detected normal data stream is provided to the decoder 720, and the supplementary data stream is provided to the supplementary data decoder 730.

The decoder 720 decodes the provided normal data stream, and provides the stream stuffer 740 with the result.

The supplementary data decoder 730 decodes the provided supplementary data stream. The supplementary data decoder 730 may decode the turbo coding data. Specifically, the supplementary data decoder 730 may include a trellis decoder (not shown), an outer de-interleaver (not shown), an outer interleaver (not shown), and outer map decoder (not shown), a frame formatter (not shown), and a symbol de-interleaver (not shown).

The trellis decoder trellis-decodes the provided supplementary data stream, and the outer de-interleaver de-interleaves the trellis-decoded stream. The outer map decoder may convolution-decode the de-interleaved stream. The outer map decoder outputs a soft decision output or a hard decision output according to the result of convolution decoding. The hard decision output of the outer map decoder, the hard decision stream, is provided to the frame formatter. The frame formatter formats the convolution-decoded hard decision stream in accordance with a dual TS frame. The symbol de-interleaver may de-interleave the frame-formatted stream from symbol unit to byte unit. If a soft decision is output from the outer map decoder, the outer interleaver interleaves the supplementary data stream and provides the trellis decoder with the result. The trellis decoder re-performs trellis decoding of the interleaved stream, and provides the outer de-interleaver with the result. The outer de-interleaver performs de-interleaving again, and provides the outer map decoder with the result. The operations of the trellis decoder, the outer de-interleaver, and the outer interleaver may be reiterated until a hard decision is output. Accordingly, a reliable decoding value can be obtained.

As explained above, the supplementary data stream processed at the supplementary data decoder 730 can also be provided to the stream stuffer 740 with the normal data stream processed at the decoder 720.

The stream stuffer 740 stuffs the supplementary data stream being decoded at the supplementary data decoder 730 into the normal data stream being output from the decoder 720, to re-construct one TS.

The de-interleaver 750 de-interleaves the TS being processed at the stream stuffer 740, and the RS decoder 760 RS-decodes the de-interleaved TS.

The de-randomizer 770 de-randomizes the RS-decoded TS. The de-MUX 780 de-multiplexes the de-randomized TS, to recover normal data and supplementary data.

The digital broadcast receiving apparatus according to an example embodiment of the present invention may be implemented in the configuration shown in FIG. 8. According to the example embodiment shown in FIG. 8, the data processor 700 may include a MUX 810, a first processor 820, and a second processor 830.

The MUX 810 divides the normal data stream and the supplementary data stream from the equalized TS, and provides the first and second processors 820 and 830 with the respective results.

The first processor 820 decodes the normal data stream to recover normal data. The first processor 820 includes a decoder 821, a first de-interleaver 822, a RS decoder 823, and a first de-randomizer 824.

The decoder 821 decodes the normal data stream, and the first de-interleaver 822 de-interleaves the decoded stream. The RS decoder 823 RS-decodes the de-interleaved stream, and the first de-randomizer 824 de-randomizes the stream being output from the RS decoder 823 to recover normal data.

The second processor 830 decodes the supplementary data stream to recover supplementary data. The second processor 830 includes a supplementary data decoder 831, a second de-interleaver 832, a parity remover 833, a second de-randomizer 834, and a data recoverer 835.

The supplementary data decoder 831 decodes the supplementary data stream provided by the MUX 810, and the second de-interleaver 832 de-interleaves the decoded supplementary data stream. The parity remover 833 removes parity bits added to the supplementary data stream, and the second de-randomizer 834 de-randomizes the parity-removed supplementary data stream.

The data recoverer 835 recovers supplementary data by processing the de-randomized supplementary data stream. The data recoverer 835 includes a de-interleaver (not shown) to de-interleave the de-randomized stream, a condenser (not shown) to remove the parity stuffing region of the de-interleaved supplementary data stream, a RS decoder (not shown) to RS-decode the stream, and a sync inserter (not shown) to recover supplementary data by inserting sync signal into the decoded stream.

Figure 9:
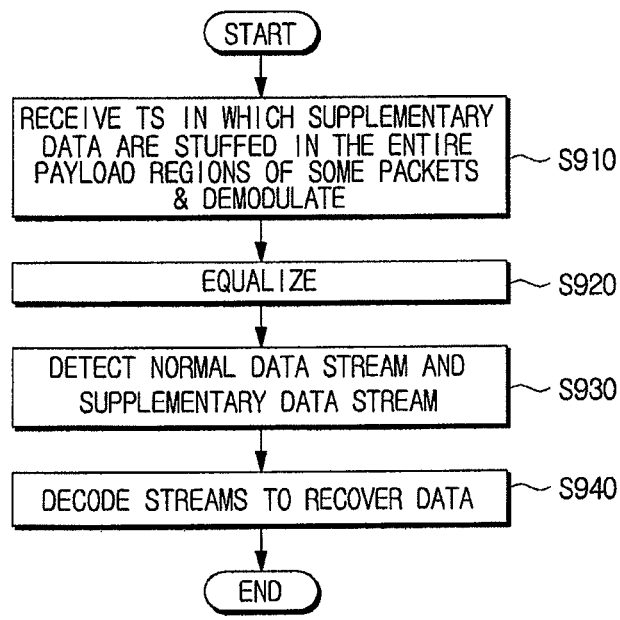
FIG. 9 is a flowchart of a process of digital broadcast reception according to an example embodiment of the present invention.

FIG. 9 is a flowchart of a digital broadcast receiving process according to an example embodiment of the present invention. A TS in which supplementary data is stuffed in the entire payload region of some packets is received and demodulated at block S910. The received stream may have the same structure as those shown in FIGS. 3 and 4.

The received stream may have a structure in which a plurality of supplementary data streams is stuffed in the entire payload regions of the packets that do not have adaptation fields.

Alternatively, the received stream may have the structure in which a plurality of supplementary data packets are divided and stuffed in the entire payload regions of some (first packets) of the packets which do not have adaptation fields, and in which one supplementary data packet is stuffed in the entire payload region of some other packets (second packets) of the packets which do not have adaptation fields.

The processed stream is equalized at block S920.

The normal data stream and the supplementary data stream are detected from the equalized stream at block S930. The supplementary data stream may be detected from predetermined locations according to the packet pattern of received stream, and a normal data stream may be detected from the other locations. Because supplementary data are stuffed in locations at intervals of a predetermined number of packets in the transmission, the predetermined number corresponding to one of the divisors of 12, the locations of the packets where the supplementary data are stuffed can be determined. As a result, the supplementary data stream can be detected if packets at predetermined intervals are in the same pattern.

As the supplementary data stream and the normal data stream are detected, the streams are decoded to recover supplementary data and normal data at block S940. Processing on the streams has been explained above with reference to the digital broadcast receiving apparatus shown in FIGS. 7 and 8, and therefore, detailed explanation thereof will be omitted.

Although a few embodiments of the present invention have been shown and described, it would be appreciated by those skilled in the art that changes may be made in this embodiment without departing from the principles and spirit of the invention, the scope of which is defined in the claims and their equivalents.

What is claimed is:

1. A digital broadcast receiving apparatus, comprising:
a demodulator to receive and demodulate a stream transmitted from a digital broadcast transmitting apparatus;
an equalizer to equalize the demodulated stream; and
a data processing unit to decode the equalized stream,
wherein the stream comprising supplementary data generated by compressing data in a compression standard which is different from a compression standard applied to normal data,
wherein the compressed supplementary data is first Reed-Solomon (RS) encoded, interleaved and processed so that an area for inserting a parity is provided, differently from the normal data to be robust against errors, and the stream is second RS encoded, interleaved and trellis encoded after the supplementary data is inserted to the stream comprising the compressed normal data in the digital broadcast transmitting apparatus,
wherein the data processing unit trellis decodes the supplementary data, deinterleaves the trellis decoded supplementary data without deinterleaving the normal data, and convolutional decodes the deinterleaved supplementary data,
wherein the data processing unit also derandomizes the convolutional decoded supplementary data, and
wherein the data processing unit further interleaves the convolutional-decoded supplementary data and re-performs the trellis decoding, the deinterleaving, and the convolutional decoding in response to a soft decision output of the convolutional decoding.

2. The digital broadcast receiving apparatus according to claim 1, wherein the stream is transmitted from the digital broadcast transmitting apparatus in which after an adapter unit constitutes the stream into which the supplementary data can be inserted and an insertion unit inserts the supplementary data into the stream, the stream is encoded, interleaved, and trellis-encoded.

3. The digital broadcast receiving apparatus according to claim 1, wherein the data processing unit comprises:
an additional data decoder to decode the supplementary data; and
a deinterleaver to deinterleave the decoded supplementary data.

4. A stream processing method for a digital broadcast receiving apparatus, the method comprising:
receiving and demodulating a stream transmitted from a digital broadcast transmitting apparatus;
equalizing the demodulated stream; and
processing data by decoding the equalized stream,
wherein the stream comprising supplementary data generated by compressing data in a compression standard which is different from a compression standard applied to normal data,
wherein the compressed supplementary data is first Reed-Solomon (RS) encoded, interleaved and processed so that an area for inserting a parity is provided, differently from the normal data to be robust against errors, and the stream is second RS encoded, interleaved and trellis encoded after the supplementary data is inserted to the stream comprising the compressed normal data in the digital broadcast transmitting apparatus,
wherein the processing the data comprises trellis decoding the supplementary data, deinterleaving the trellis decoded supplementary data without deinterleaving the normal data, and convolutional decoding the deinterleaved supplementary data,
wherein the processing the data further comprises derandomizing the convolutional decoded supplementary data, and
wherein the processing the data further comprises interleaving the convolutional-decoded supplementary data and re-performing the trellis decoding, the deinterleaving, and the convolutional decoding in response to a soft decision output of the convolutional decoding.

5. The stream processing method according to claim 4, wherein the stream is
transmitted from the digital broadcast transmitting apparatus in which the stream is constituted to be able to include the supplementary data, the supplementary data are inserted into the stream, and the stream is encoded, interleaved, and trellis-encoded.

6. The stream processing method according to claim 4, wherein the processing the data comprises:
decoding the supplementary data; and
deinterleaving the decoded supplementary data.

* * * * *